(12) United States Patent
Keidar-Barner et al.

(10) Patent No.: US 8,453,082 B2
(45) Date of Patent: May 28, 2013

(54) SOFT ERROR VERIFICATION IN HARDWARE DESIGNS

(75) Inventors: Sharon Keidar-Barner, Yokneam Ilit (IL); Ohad Shacham, Kfar Monash (IL); Karen Frida Yorav, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 12/877,117

(22) Filed: Sep. 8, 2010

(65) Prior Publication Data

US 2012/0060064 A1    Mar. 8, 2012

(51) Int. Cl.
*G06F 17/50*    (2006.01)

(52) U.S. Cl.
USPC .................................................. 716/106

(58) Field of Classification Search
USPC .................................................. 716/106
See application file for complete search history.

(56) References Cited

U.S. PATENT DOCUMENTS

| | | | | |
|---|---|---|---|---|
| 7,320,114 | B1 * | 1/2008 | Jain et al. ..................... | 716/106 |
| 7,627,840 | B2 * | 12/2009 | Kleinosowski et al. ...... | 716/106 |
| 7,926,021 | B2 * | 4/2011 | Blome et al. .................. | 716/136 |
| 2007/0226572 | A1 | 9/2007 | Zhang et al. | |
| 2009/0172529 | A1 | 7/2009 | Jas et al. | |

OTHER PUBLICATIONS

Frehse et al., "A better-than-worst-case robustness measure", Design and Diagnostics of Electronic Circuits and Systems (DDECS), 2010 IEEE 13th International Symposium on, pp. 78-83, Apr. 14-16, 2010.*
Zhang et al., "FASER: Fast Analysis of Soft Error Susceptibility for Cell-Based Designs", ISQED '06 Proceedings of the 7th International Symposium on Quality Electronic Design, pp. 755-760, Mar. 27-29, 2006.*

* cited by examiner

*Primary Examiner* — Jack Chiang
*Assistant Examiner* — Brandon Bowers
(74) *Attorney, Agent, or Firm* — Ziv Glazberg; Glazberg & Applbaum Co.

(57) ABSTRACT

Soft error detection is performed by computation of states based on formal methods and by simulating a synthesized target identification logic together with the design. Soft errors may be simulated in response to detecting that a simulated state of the design is comprised by the states. A BDD representation of the design may be utilized to determine the states. A Boolean satisfiability problem may be defined and solved using an all-SAT solver in order to determine the states.

23 Claims, 4 Drawing Sheets

SOFT ERROR VERIFICATION IN HARDWARE DESIGNS

BACKGROUND

The present disclosure relates to error detection in hardware designs in general, and to detection of errors caused due to soft errors that were not handled properly, in particular.

Computerized devices are an important part of the modern life. They control almost every aspect of our life—from writing documents to controlling traffic lights. However, computerized devices are bug-prone, and thus require a verification phase in which the bugs should be discovered. The verification phase is considered one of the most difficult tasks in developing a computerized device. Many developers of computerized devices invest a significant portion, such as 70%, of the development cycle to discover erroneous behaviors of the computerized device, also referred to as a target computerized system. The target computerized system may comprise hardware, software, firmware, a combination thereof and the like. In some cases, a target device is defined by a design, such as provided by a hardware descriptive language such as VHDL, SystemC, or the like.

A soft error, or a fault, is a transient bit-flip or similar value modification that occurs spontaneously. In some cases, the soft error may be caused due to particle strike. An error in a design occurs when a fault results in data corruption. Typically for hardware designs, an error may be a situation when a corrupted value appears on the outputs of the design (or on a predefined set of cut-points). A fault does not always become an error; it may vanish through logical masking, electrical masking, fault detection modules, and the like. Whether or not a fault becomes an error may depend on a state of the target computerized system when the fault occurs and on input values in subsequent cycles.

Some hardware designs contain fault detection logic configured to detect, correct and/or recover from a fault. In response to detection of a fault, the design may, in some cases recover, such as for example by re-loading a previously saved clean state and re-computing values.

Soft error verification may be performed to detect scenarios in which faults are not handled as they turn to errors. In some cases, a simulated execution of the design is performed, and a fault is simulated by modifying a value of a variable, such as by flipping a value of a latch (also referred to as injecting a bit-flip to the latch). In case the fault detection logic does not handle the fault, it may result in an error during simulation. A huge number of simulation runs may be required in order to achieve appropriate coverage, and this is rarely accomplished on industrial designs.

soft error verification is specifically critical in computerized devices that are operated in a hazardous environment, such as outer-space. Such devices may be extremely expensive, and an undetected bug in them may be very costly. For example, consider a bug in a satellite which may cause the satellite to crash. Even a relatively simple bug, such as that causes the satellite to not function correctly may be very expensive to fix, as fixing it may require sending people to outer-space.

BRIEF SUMMARY

One exemplary embodiment of the disclosed subject matter is a method for detecting an error in a design that may be caused due to a soft error, the method comprising: obtaining the design, wherein the design comprising a plurality of variables and a transition relation from a state to a next state based on at least one input signal; computing a set of states of the design in respect to a variable of the plurality of variables, wherein for each state of the set of states, in case a value of the variable is changed due to the soft error, there exists one or more consecutive values to the at least one input signal that result in an error in the design; synthesizing a target identification logic configured to detect if a current state of the design is comprised by the set of states; simulating the design and the target identification logic, wherein the simulating is performed by a processor; the simulating comprising in response to a detection by the target identification logic, changing a value of the variable to simulate the soft error; and determining whether the error in the design occurred during the simulating.

Another exemplary embodiment of the disclosed subject matter is a computerized apparatus for detecting an error in a design that may be caused due to a soft error, the computerized apparatus having a processor and a storage device; the computerized apparatus comprising: a design obtainer operative to obtain the design, wherein the design comprising a plurality of variables and a transition relation from a state to a next state based on at least one input signal; a target definer configured to determine a set of states of the design in respect to a variable of the plurality of variables, wherein for each state of the set of states, in case a value of the variable is changed due to the soft error, there exists one or more consecutive values to the at least one input signal that result in an error in the design; a target identification logic synthesizer configured to synthesize a target identification logic configured to detect if a current state of the design is comprised by the set of states determined by the target definer; a simulator configured to simulate operation of the design and the target identification logic synthesized by the target identification logic synthesizer; wherein the simulator is operately coupled to a soft error triggering module, the soft error triggering module is configured to change a value of the variable associated with the target identification logic in response to a determination by the target identification logic during simulation that the current state is comprised by the set of states; and wherein the simulator is operately coupled to an error identification module, the error identification module is configured to indicate whether there is an error in the design based on simulated states of the design.

Yet another exemplary embodiment of the disclosed subject matter is a computer program product for detecting an error in a design that may be caused due to a soft error, the computer program product comprising: a computer readable medium; a first program instruction operative to obtain the design, wherein the design comprising a plurality of variables and a transition relation from a state to a next state based on at least one input signal; a second program instruction operative to compute a set of states of the design in respect to a variable of the plurality of variables, wherein for each state of the set of states, in case a value of the variable is changed due to the soft error, there exists one or more consecutive values to the at least one input signal that result in an error in the design; a third program instruction operative to synthesize a target identification logic configured to detect if a current state of the design is comprised by the set of states; a fourth program instruction operative to simulate the design and the target identification logic, the fourth program instruction is further operative to change a value of the variable to simulate the soft error in response to a detection by the target identification logic during simulation; a fifth program instruction operative to determine whether the error in the design occurred during the simulating; and wherein the first, second, third, fourth and fifth program instructions are stored on the computer readable media.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
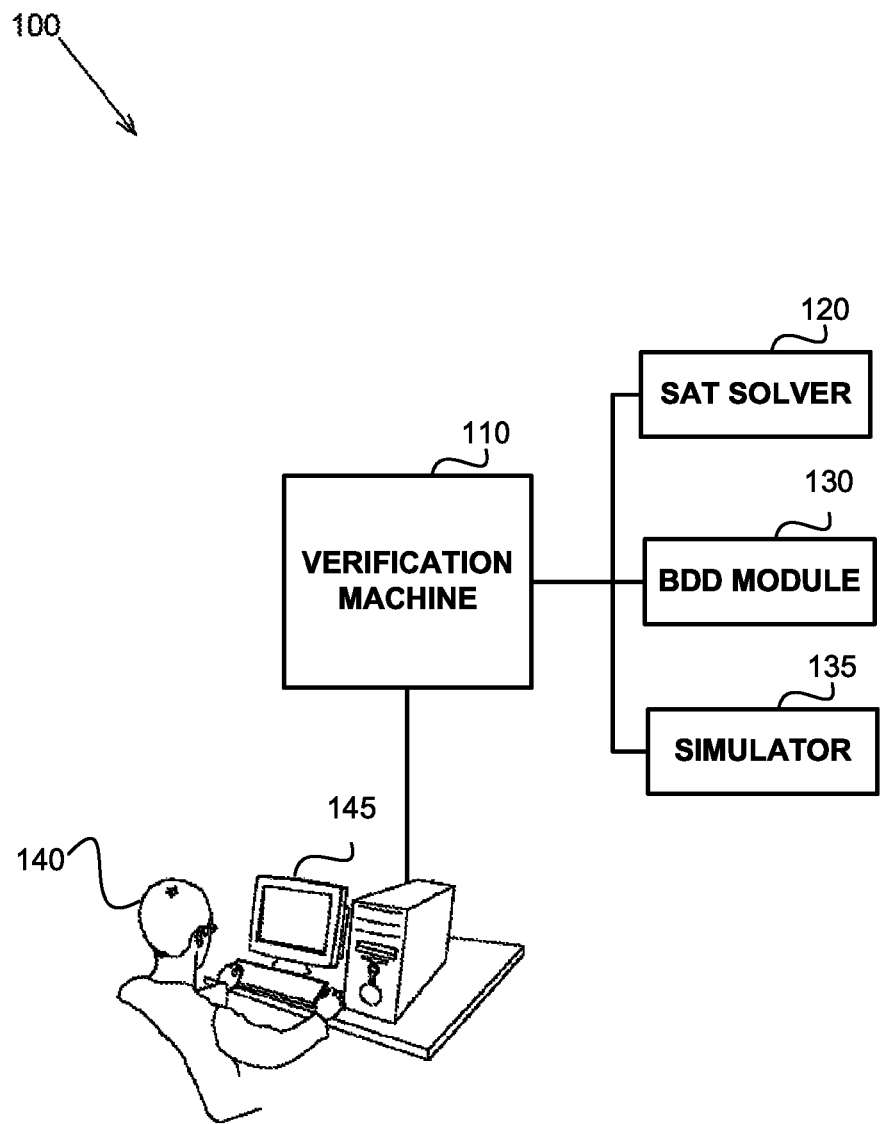
FIG. 1 shows a computerized environment in which the disclosed subject matter is used, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to detect errors in the design that may be caused due to faults. The disclosed subject matter may be utilized to verify correctness of a fault detection logic, of correction activities, of data recovery and the like.

One technical solution is to determine a set of target states. The target states are states that if a bit-flip or similar value modification of an associated variable occurs in them, the fault may cause an error. A simulation may be performed and bit-flip may be injected in response to a determination that the simulated state is in the set of target states. Another technical solution is to determine the target states using Binary Decision Diagrams (BDDs). Reverse reachability analysis may be performed on a BDD representative of a comparative design. The comparative design may comprise two copies of the target design, and compare their respective outputs to see whether they are different. Based upon the BDD, reverse reachability analysis may be performed from a set of states in which the outputs of the two copies differ to the set of target states. Yet another technical solution is to determine the target states using an all-SAT solver. A Boolean satisfiability problem may be defined to represent a fault in a variable resulting in an error within a bounded number of cycles of the design. An all-SAT solver may be utilized to determine the set of target states. Yet another technical solution is to synthesize a target identification logic associated with detecting a state of the target states. Simulation of the design and the target identification logic may be performed. In response to a detection by the target identification logic, a fault may be simulated, such as by injecting a bit-flip to the associated latch. Yet another technical solution is to approximate the set of target states or to approximate the target identification logic.

One technical effect of utilizing the disclosed subject matter is to increase the probability of finding an error caused by a fault. Another technical effect is enabling the utilization of formal methods in conjunction with simulation to provide for a relatively reliable verification process with respect to soft errors. Yet another technical effect is to enable dynamic identification of states and latches from which a bit-flip, or other simulated fault, may be simulated. This is in contrast to randomly or heuristically simulating soft errors during simulations. Yet another technical effect is reducing a number of states in which fault simulation may be performed. Yet another technical effect is to utilize formal methods on a large model, without performing a full state exploration of the entire model, which is likely not feasible when using formal methods.

It will be noted that in the present disclosure, an error is a change in an observable output (or cut-off point) caused due to a soft error. This is in opposition to a functional error, which is defined by the design not holding a specification property.

Referring now to FIG. 1 showing a computerized environment in which the disclosed subject matter is used, in accordance with some exemplary embodiments of the subject matter. A computerized environment 100 may comprise a verification machine 110.

The verification machine 110 is configured to perform verification on a design associated with a target computerized device, such as a circuit, a hardware component or the like. In some exemplary embodiments, the design may be provided by a user 140, such as a verification engineer, a specification designer, a QA staff member or the like. In some exemplary embodiments, the design may be given in a Hardware Descriptive Language, such as VHDL, SystemC or the like. The design may define a state of the target computerized device in a discrete cycle using one or more values to variables, such as representing latches (also referred to as flipflops). The design may further define a transition relation function between a current state and a next state based on the current state and based on input signals.

In some exemplary embodiments, the verification machine 110 may comprise hardware, software and/or firmware components, combination thereof or the like. The verification machine 110 may be operately coupled to other computerized modules useful for performing verification in accordance with the disclosed subject matter.

In some exemplary embodiments, the verification machine 110 may be operately coupled to a simulator 135. The simulator 135 be configured to simulate an execution of the design. A simulation of the design may comprise determining a current state and inputs based on the design. In some exemplary embodiments, the simulation is performed in respect to a predefined environment which may provide constraints over the inputs of the design.

In some exemplary embodiments, the verification machine 110 may be operately coupled to a SAT solver 120. The SAT solver 120 may be configured to determine all satisfying assignments of a Boolean Satisfiability problem.

In some exemplary embodiments, the verification machine 110 may be operately coupled to a BDD module 130. The BDD module 130 may be configured to perform operations on set of states represented by a BDD.

In some exemplary embodiments, the verification machine 110 may utilize the BDD module 130, the SAT solver 120, or a combination thereof, to determine a set of target states. During simulation performed by the simulator 135, the verification machine 110 may simulate a fault in a latch associated with a detected target state.

In some exemplary embodiments, the user 140 may utilize a Man-Machine Interface (MMI) 145, such as a terminal, to review output from the verification machine 110 and/or to provide input to the verification machine 110.

Figure 2:
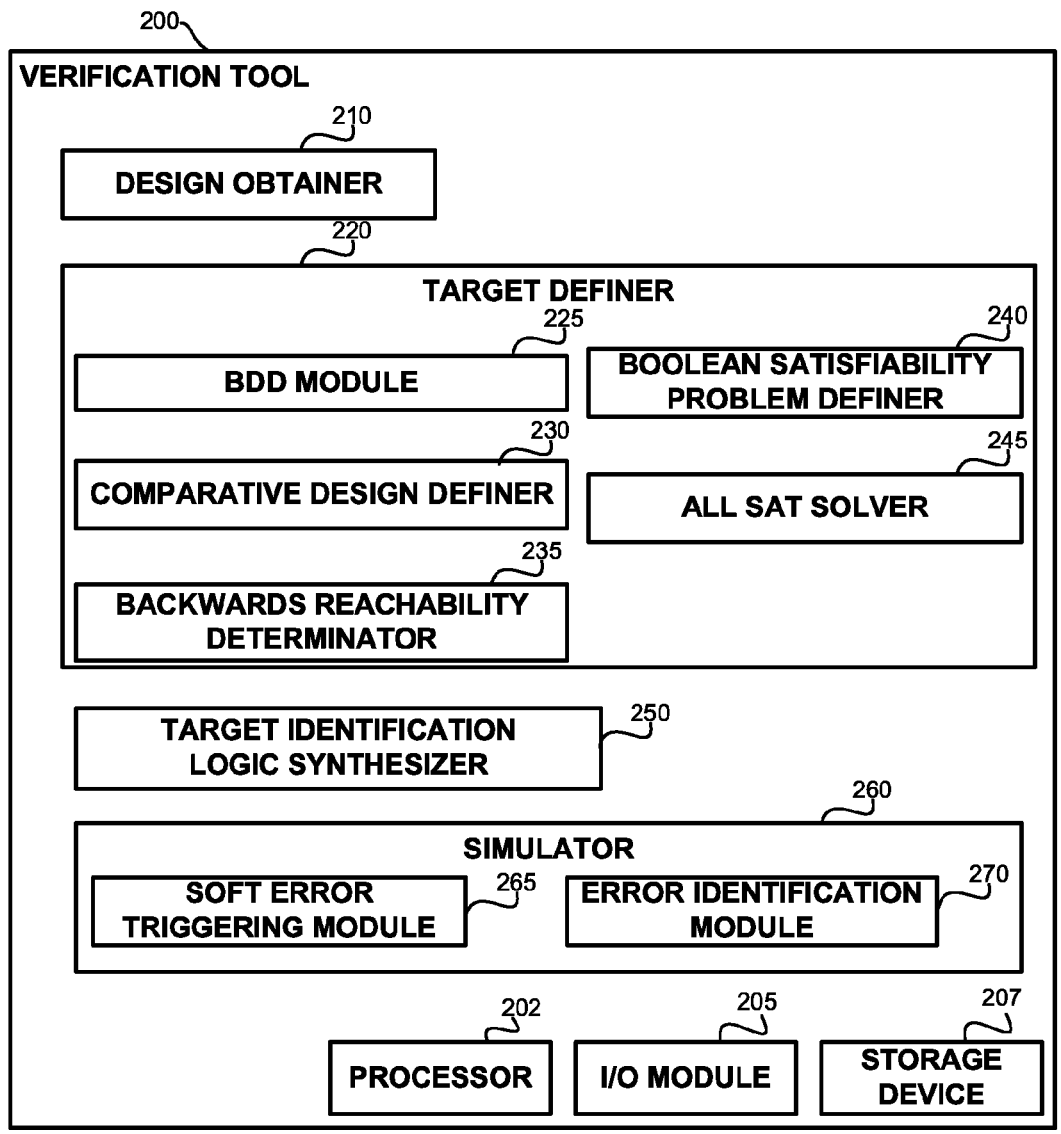
FIG. 2 shows a block diagram of a verification tool, in accordance with some exemplary embodiments of the disclosed subject matter.

Referring now to FIG. 2 showing a block diagram of verification tool, in accordance with some exemplary embodiments of the disclosed subject matter. A verification tool 200, such as 110 of FIG. 1, may be configured to detect a fault in the design that may cause an error.

In some exemplary embodiments, a design obtainer 210 may be configured to obtain a design to be verified by the verification tool 200. The design obtainer 210 may obtain the design from a user, such as 140 of FIG. 1, from a file, from a predetermined interface, or the like.

In some exemplary embodiments, a target definer 220 may be configured to define a set of target states in respect to a latch. Target states may be states such that if a fault occurs in the latch while the system is in a target state, then an error may occur. In some cases, there exists a list of consecutive input signals that will cause the fault to become an error. In other cases, target states may be defined in a more restrictive manner—for every set of consecutive input signals, the fault becomes an error. In some exemplary embodiments, the target definer 220 may define an approximated set of target states. Approximation may be an under-approximation or an over-approximation. Approximation may be utilized in order to simplify the computational complexity of the target definer 220.

In some exemplary embodiments, a BDD module 225 may be configured to perform operations on a BDD.

In some exemplary embodiments, a comparative design definer 230 may be configured to determine a comparative design. The comparative design may comprise two copies of the design, receiving the same input values. The comparative design may be configured to indicate whether the output of the two copies is different. For example, the output of the comparative design may be defined as a logical XOR operation between an output of the first copy and a corresponding output of the second copy.

In some exemplary embodiments, a backwards reachability determinator 235 may be configured to determine a set of states from which the indication of the comparative design is reachable. In some exemplary embodiments, the backwards reachability determinator 235 may utilize the BDD module 225 to represent sets of states.

Figure 4:
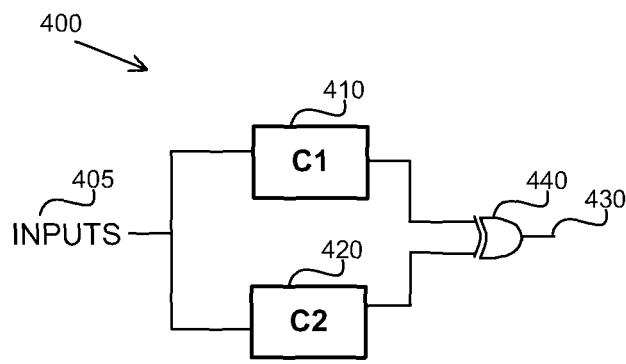
FIG. 4 shows an illustration of a comparative design, in accordance with some exemplary embodiments of the disclosed subject matter.

Let $C=\langle I,O,L,N\rangle$ be the design, with inputs I, outputs O, latches L, and next-state functions $N=\{N_l | l \in L\}$, where each $N_l$ is a function from I×L to $2^{\langle 0,1\rangle}$ determining the value of l in the next clock cycle based on the current values of latches in L and inputs in I. In some cases, the design may comprise a detection logic. The detection logic may comprise a detection flag, such as a signal that is raised in response to a detection of a fault. The detection flag is denoted by "det". Let t∈L be a designated latch for which the target states need to be determined. The comparative design may contain two copies of C ($C_1=\langle I_1, O_1, L_1, N_1\rangle$ and $C_2=\langle I_2, O_2, L_2, N_2\rangle$) and comparison logic such that in case that an output of $C_1$ is different than the corresponding output of $C_2$ then an error bit is raised. A comparative design 400 of FIG. 4 shows an exemplary comparative design. Inputs 405 are used by both $C_1$ 410 and $C_2$ 420. An output value 430 is based on a XOR operation between outputs of $C_1$ and $C_2$. The XOR operation may be implemented using a XOR gate 440.

In some exemplary embodiments, the target definer 220 may compute the target states in respect to the latch t by performing the following operations:

i←1

Build a BDD for $f_1$=error (This is a relatively small BDD that represents all the states, reachable or not, in which error is asserted)

Perform backward reachability from $f_1$. For example, perform iteratively i←i+1 front←$[EX(f_{i-1}) \wedge !det_1 \wedge !det_2]$, where EX(A) is defined as the set of states that have a successor in the BDD A. In other words, front may be a set of states that have a successor state in $f_{i-1}$ and in which the detection flag is not raised in both copies of the design.

$f_i \leftarrow f_{i-1} \wedge$ front until ($f_i=f_{i-1}$), or until a determination to stop the reachability (e.g., due to limited available resources).

from $f_i$ extract all the states that differ only in the value of the variable t (i.e., $t_1 \neq t_2$, and $\forall l \in L$, $l \neq t, l_1 = l_2$).

From the extracted states, take the state of only one of the copies (e.g., quantify out the state bits of $C_2$)

In some exemplary embodiments, the design may not comprise a detection flag. Therefore the set front may be determined to be $EX(f_{i-1})$.

In some exemplary embodiments, a Boolean satisfiability problem definer 240 may be configured to define a Boolean satisfiability problem associated with a bounded comparative design. The bounded comparative design may comprise state variables for two copies of the design for each cycle of a predetermined number of cycles. The values of the state variables may be defined based on combinatorial logic of the design, based on values of the state variables of a previous cycle and based on input signals of the current cycle. The bounded comparative logic may be configured to determine an output value indicating whether there is a difference in an output of the two copies. The bounded comparative logic may be configured to simulate a bit flip in the variable in one of the copies.

Figure 5:
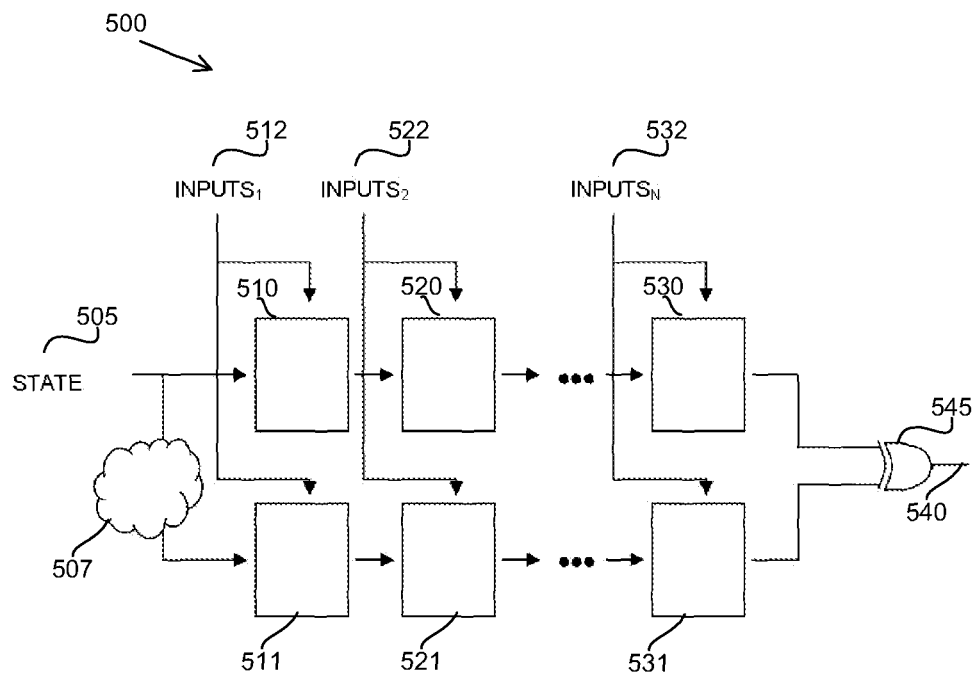
FIG. 5 shows an illustration of a bounded comparative design, in accordance with some exemplary embodiments of the disclosed subject matter.

A bounded comparative design 500 of FIG. 5 shows an exemplary bounded comparative design, in accordance with some exemplary embodiments of the disclosed subject matter. An output value 540 is determined based on a difference between outputs of a first bounded copy of the design, represented by logic 510, 520 and 530, and a second bounded copy of the design, represented by logic 511, 521, 531. A XOR gate 545 may be utilized to determine whether the outputs are the same. Initial state variables 505 may be given as input to both copies of the bounded design. A bit-flip logic 507 may be configured to simulate a bit flip in the value of the variable, such that the given initial state of the first copy is the same as that given for the second copy except for the value of the one chosen variable. The same inputs may be given to both copies in each cycle (e.g., inputs$_1$ 512, inputs$_2$ 522, inputs$_N$ 532). In each cycle, the state variables of the previous states are used together with the input signals to determine the output and the next state. For example, the logic 520 (which is the same as 511) computes the state in the second cycle based on the inputs in the second cycle (inputs$_2$ 522) and based on the state in the first cycle, which is computed by the logic 510.

In some exemplary embodiments, the design may be partitioned into two parts, state bits and combinational function that computes the next state based on inputs and the initial state. The combinational logic may be duplicated, wherein each copy corresponds to a different clock cycle. For example, the logic 510 and 520 may be the same logic, each corresponding to a different cycle. In some exemplary embodiments, several different bounded comparative designs may be determined, each may be associated with a different variable and/or a different number of cycles.

In some exemplary embodiments, an all-SAT solver 245 may be configured to determine all satisfying assignments to the Boolean satisfiability problem defined by the Boolean satisfiability problem definer 240. In some exemplary embodiments, the all-SAT solver 245 may be a SAT solver configured to repeatedly provide satisfying assignments to the same Boolean satisfiability problem. In some exemplary embodiments, the all-SAT solver 245 may be a SAT solver, such as DPLL-based SAT solver configured to iteratively solve the SAT problem and determine new satisfying assignments until an UNSAT is determined. In some exemplary embodiments, the all-SAT solver 245 may implement the method described in E. Arbel, O. Rokhlenko, K. Yorav "SAT-based synthesis of clock gating functions using 3-valued abstraction" FMCAD'09, which is hereby incorporated by reference.

In some exemplary embodiments, the target definer 220 may be configured to utilize the Boolean satisfiability problem definer 240 to determine Boolean satisfiability problems with respect to each variable and with respect to each possible bound on the design, up to the depth of the design. The all-SAT solver 245 may be configured to determine all possible satisfying assignments of each defined problem. In such a case the target definer 220 may determine all possible target states. In some exemplary embodiments, a portion of the problems and/or of the assignments may be omitted from computations. In such a case, the target definer 220 may determine an under-approximated set of the target definer 220. In some exemplary embodiments, the portions may be omitted due to limited resources, such as computational power, time or the like.

In some exemplary embodiments, the target definer 220 may be an approximated target definer that is configured to approximate the set of target states. The approximated set may be an under-approximation (e.g., comprising a portion of the complete set), an over-approximation (e.g., comprising the complete set and surplus states), or the like. In some exemplary embodiments, an approximated backward reachability analysis may be performed, such as by performing an approximated backward step, or the like.

In some exemplary embodiments, a target identification logic synthesizer 250 may be configured to synthesize a target identification logic that is configured to detect whether a state of the design is comprised by the target states determined by the target definer 220. "Synthesizing", in this context, does not necessarily include fabricating an actual circuit of similar component. In some exemplary embodiments, the target identification logic synthesizer 250 may determine an automaton that checks whether or not a state is a target state. The target identification logic may be a set of logical operations, a checker, a circuit, or the like, such as defined using a HDL.

In some exemplary embodiments, the target identification logic synthesizer 250 may be an approximated target identification logic synthesizer. The approximated target identification logic synthesizer may be configured to synthesize an approximated target identification logic which is configured to approximate whether a current state of the design is comprised by the set of target states. For example, the approximated target identification logic may perform its determination without checking all bits that represent the state. Approximation may be used in case of computationally-hard designs or sets of states. In some exemplary embodiments, synthesizing the target identification logic may require non-polynomial computation time, which may, in some cases, be not feasible. Approximation may enable feasible, though not exact, operation.

In some exemplary embodiments, a simulator 260 may be configured to simulate an execution of a design. The simulator 260 may be configured to simulate the execution of the design received by the design obtainer 210 and the target identification logic determined by the target identification logic synthesizer 250.

In some exemplary embodiments, a soft error triggering module 265 may be configured to trigger a soft error simulation in response to a simulated execution in which a target state is detected. In response to a detection by the target identification logic, the soft error triggering module 265 may trigger a simulated soft error in a variable associated with the target state detected by the target identification logic. The simulated soft error may be, for example, injecting a bit flip to the variable. In some exemplary embodiments, in case more than one target identification logics detect a target state, the state may be duplicated and two or more simulated executions may be invoked, each associated with a simulated soft error in a different variable.

In some exemplary embodiments, an error identification module 270 may be configured to determine whether a simulated state by the simulator 260 is an error. An error may be determined based on a value of an output of the design, based on a value in a cut-off point, or the like.

In some exemplary embodiments, a soft error occurring (or simulated to occur) in a unit of the design may be handled in another unit of the design. Therefore, using a simulator 260 is more likely feasible than using formal methods on the entire design, which may be too large to be handled by currently known formal methods.

The storage device 207 may be a Random Access Memory (RAM), a hard disk, a Flash drive, a memory chip, or the like. The storage device 207 may retain the design obtained by the design obtainer 210, the one or more sets of target states determined by the target definer 220, the one or more target identification logics synthesized by the target identification logic synthesizer 250, the simulated state of the design and/or the target identification logic simulated by the simulator 260 or the like.

In some exemplary embodiments of the disclosed subject matter, the verification tool 200 may comprise an Input/Output (I/O) module 205. The I/O module 205 may be utilized to provide an output to and receive input from a user, such as 140 of FIG. 1.

In some exemplary embodiments, the verification tool 200 may comprise a processor 202. The processor 202 may be a Central Processing Unit (CPU), a microprocessor, an electronic circuit, an Integrated Circuit (IC) or the like. The processor 202 may be utilized to perform computations required by the verification tool 200 or any of it subcomponents.

In some exemplary embodiments, components of the verification tool 200 may be implemented in software, hardware, firmware or the like. For example, the simulator 260 may be implemented by a software code retained in the storage device 207 and by the processor 202 performing computation in accordance with the software code.

Figure 3:
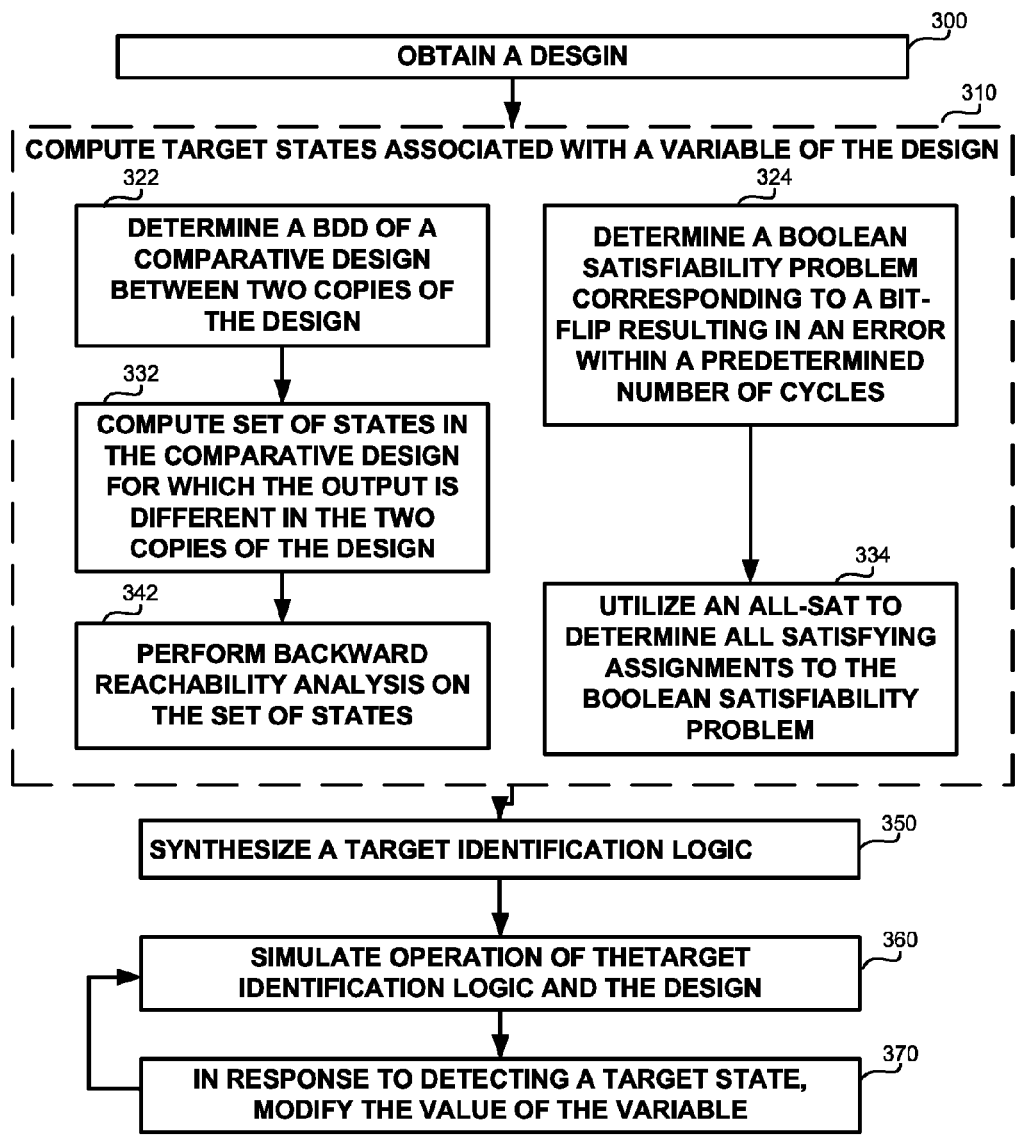
FIG. 3 shows a flowchart diagram of a method, in accordance with some exemplary embodiments of the disclosed subject matter.

Referring now to FIG. 3 showing a flowchart diagram of a method in accordance with some exemplary embodiments of the disclosed subject matter.

In step 300, a design may be obtained. The design may be obtained by a design obtainer, such as 210 of FIG. 2.

In step 310, target states associated with a variable of the design may be computed. The target states may be computed by a target definer, such as 220 of FIG. 2. In some exemplary embodiments, target states may be computed using BDDs or using Boolean satisfiability problems or the like.

In step 322, a BDD of a comparative design between two copies of the design may be determined The comparative design may be determined by a comparative design definer, such as 230 of FIG. 2. The comparative design may be represented by a BDD using a BDD module, such as 225 of FIG. 2.

In step 332 a set of states in the comparative design for which the output is different in the two copies of the design may be determined The set of states may be determined by the BDD module.

In step 342, a backward reachability analysis of the set of states determined in step 332 may be performed. The backward reachability analysis may be performed by a backwards reachability determinator, such as 235 of FIG. 2. The backward reachability analysis may be performed until a fix-point is determined, or until a determination to stop the analysis, such as for example in case of BDD representations becoming relatively big and requiring a relatively high amount of memory, in case of time limit reached or the like.

In some exemplary embodiments, steps 324 and 334 may be performed in order to compute the target states.

In step 324, a Boolean satisfiability problem may be defined to correspond to a bit-flip resulting in an error within a predetermined number of cycles. The Boolean satisfiability problem may be defined by a Boolean satisfiability problem definer, such as 240 of FIG. 2.

In step 334 an all-SAT solver, such as 245 of FIG. 2, may be utilized to determine all satisfying assignments of the problem defined in step 324.

In some exemplary embodiments, steps 324 and 334 may be performed a plurality of times, each time in respect to a different number of cycles.

In step 350, a target identification logic may be synthesized from the target states determined in step 310. The target identification logic may be synthesized by a target identification logic synthesizer, such as 250 of FIG. 2.

In some exemplary embodiments, steps 310 and 350 may be performed a plurality of times, each time in respect to a different latch or variable of the design.

In step 360, an operation of the design and the target identification logic may be simulated. The simulation may be performed by a simulator, such as 260 of FIG. 2.

In step 370, in response to a detection by the target identification logic that a current state of the design is a target state, a simulation of a soft error may be performed. The soft error may be simulated by modifying the value of the variable associated with the triggered target identification logic. The soft error may be simulated, for example, by injecting a bit-flip. The operation of step 370 may be performed b a soft error triggering module, such as 265 of FIG. 2.

In some exemplary embodiments, in response to triggering a simulated soft error, the simulation may continue and an error may be detected. In some exemplary embodiments, a plurality of simulated executions may be performed in order to provide for a relatively high coverage.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for detecting an error in a design that may be caused due to a soft error, the method comprising:
    obtaining the design, wherein the design comprising a plurality of variables and a transition relation from a state to a next state based on at least one input signal;
    computing a set of states of the design in respect to a variable of the plurality of variables, wherein for each state of the set of states, in case a value of the variable is changed due to the soft error, there exists one or more consecutive values to the at least one input signal that result in an error in the design;
    synthesizing a target identification logic configured to detect if a current state of the design is comprised by the set of states;
    simulating the design and the target identification logic, wherein said simulating is performed by a processor; said simulating comprising in response to a detection by the target identification logic, changing a value of the variable to simulate the soft error; and
    determining whether the error in the design occurred during said simulating.

2. The method of claim 1, wherein said changing a value comprises performing a bit-flip operation.

3. The method of claim 1, wherein the variable is a binary variable.

4. The method of claim 1, wherein said computing comprises:
    determining a Binary Decision Diagram (BDD) representative of a second design having input signals and an output signal, wherein the second design comprising two copies of the design, wherein the two copies of the design are configured to receive the input signals, wherein second design is configured to provide a predetermined output value in case output values of the two copies are different;
    computing a set of states in which the predetermined output value is outputted from the second design;
    iteratively determining, using the BDD, a set of states having a successor in a previously determined set of states;
    determining a portion of the set of states in which values of the two copies differ only in respect to the variable; and
    determining set of states in respect to the design based on values of one of the two copies in the portion of the set of states.

5. The method of claim 4, wherein the design comprising a fault detection flag; and wherein said iteratively determining comprises determining the set of states having the successor in the previously determined set of states; and wherein the set of states is further characterized in that the fault detection flag is not raised.

6. The method of claim 1, wherein said computing comprises:
    determining a Boolean satisfiability problem corresponding to a bit flip occurring in the variable in a first copy of the design, and an error being outputted in the first copy of the design but not in a second copy of the design within a predetermined number of cycles; and
    solving the Boolean satisfiability problem using an all-SAT solver.

7. The method of claim 6, wherein the Boolean satisfiability problem corresponds to a bit flip occurring in the variable in the first copy of the design and a fault detection flag is not raised in the first copy within the predetermined number of cycles.

8. The method of claim 6 comprising:
    determining a plurality of Boolean satisfiability problems, each corresponding to a different number of cycles; and
    solving the plurality of Boolean satisfiability problems.

9. The method of claim 1, wherein said computing and said synthesizing are performed in respect to a plurality of variables, each corresponds to a different target identification logic; and wherein said simulating comprises simulating the design and the target identification logics.

10. The method of claim 1, wherein said computing the set of states comprises computing an approximated set of states.

11. The method of claim 1, wherein said synthesizing the target identification logic comprises synthesizing an approximated target identification logic.

12. The method of claim 1, wherein the set of states computed in said computing is characterized in that that in case the value of the variable is changed all consecutive values of the at least one input signal result in the error in the design.

13. The method of claim 1, wherein the design is a circuit design defined using a hardware descriptive language.

14. A computerized apparatus for detecting an error in a design that may be caused due to a soft error, the computerized apparatus having a processor and a storage device; the computerized apparatus comprising:
   a design obtainer operative to obtain the design, wherein the design comprising a plurality of variables and a transition relation from a state to a next state based on at least one input signal;
   a target definer configured to determine a set of states of the design in respect to a variable of the plurality of variables, wherein for each state of the set of states, in case a value of the variable is changed due to the soft error, there exists one or more consecutive values to the at least one input signal that result in an error in the design;
   a target identification logic synthesizer configured to synthesize a target identification logic configured to detect if a current state of the design is comprised by the set of states determined by said target definer;
   a simulator configured to simulate operation of the design and the target identification logic synthesized by said target identification logic synthesizer;
   wherein said simulator is operately coupled to a soft error triggering module, said soft error triggering module is configured to change a value of the variable associated with the target identification logic in response to a determination by the target identification logic during simulation that the current state is comprised by the set of states; and
   wherein said simulator is operately coupled to an error identification module, said error identification module is configured to indicate whether there is an error in the design based on simulated states of the design.

15. The computerized apparatus of claim 14, wherein said soft error triggering module is configured to perform a bit-flip to the value of the variable.

16. The computerized apparatus of claim 14, wherein said target definer is operately coupled to a BDD module, said BDD module is configured to perform operation on a BDD.

17. The computerized apparatus of claim 16, wherein said target definer is operately coupled to a comparative design definer, said comparative design definer is configured to define a comparative design; wherein the comparative design comprises two copies of the design; wherein values of inputs of the comparative design are assigned to inputs of both the two copies of the design; and wherein an output of the comparative design is configured to indicate whether a first value of an output in the first copy is different than a second value of the output in the second copy.

18. The computerized apparatus of claim 17, wherein said target definer is operately coupled to a reachability determinator configured to determine set of states from which the indication of the comparative design is reachable.

19. The computerized apparatus of claim 14, wherein said target definer is operative to define the set of target states that in case a value of the variable is changed due to the soft error, there exists one or more consecutive values to the at least one input signal that result in an error in the design and do not cause a fault detection flag to be raised.

20. The computerized apparatus of claim 14, wherein said target definer is operately coupled to a Boolean satisfiability problem definer configured to determine a Boolean satisfiability problem corresponding to a bit flip occurring in the variable in a first copy of the design and an error being outputted in the first copy of the design but not in a second copy of the design within a predetermined number of cycles; and wherein said target definer is operately coupled to an all-SAT solver configured to calculate all possible satisfying assignments to the Boolean satisfiability problem defined by said Boolean satisfiability problem definer.

21. The computerized apparatus of claim 14, wherein said target definer is an approximated target definer configured to approximate a set of states of the design in respect to the variable of the plurality of variables.

22. The computerized apparatus of claim 14, wherein said target identification logic synthesizer is an approximated target identification logic synthesizer that is configured to synthesize an approximated target identification logic configured to approximate if a current state of the design is comprised by the set of states determined by said target definer.

23. A computer program product for detecting an error in a design that may be caused due to a soft error, said computer program product comprising:
   a non-transitory computer readable medium;
   a first program instruction operative to obtain the design, wherein the design comprising a plurality of variables and a transition relation from a state to a next state based on at least one input signal;
   a second program instruction operative to compute a set of states of the design in respect to a variable of the plurality of variables, wherein for each state of the set of states, in case a value of the variable is changed due to the soft error, there exists one or more consecutive values to the at least one input signal that result in an error in the design;
   a third program instruction operative to synthesize a target identification logic configured to detect if a current state of the design is comprised by the set of states;
   a fourth program instruction operative to simulate the design and the target identification logic, the fourth program instruction is further operative to change a value of the variable to simulate the soft error in response to a detection by the target identification logic during simulation;
   a fifth program instruction operative to determine whether the error in the design occurred during said simulating; and
   wherein said first, second, third, fourth and fifth program instructions are stored on said computer readable media.

* * * * *